US005204678A

United States Patent [19]

Foley

[11] Patent Number: 5,204,678

[45] Date of Patent: Apr. 20, 1993

[54] DUAL-RANKED TIME-INTERVAL CONVERSION CIRCUIT

[75] Inventor: Clark P. Foley, Portland, Oreg.

[73] Assignee: Tektronix, Inc., Wilsonville, Oreg.

[21] Appl. No.: 834,190

[22] Filed: Feb. 10, 1992

[51] Int. Cl.[5] .............................................. H03M 1/50

[52] U.S. Cl. .................................... 341/152; 341/166

[58] Field of Search ............... 341/152, 166, 142, 155, 341/167, 168, 169, 170, 159, 161; 368/117, 120

[56] References Cited

U.S. PATENT DOCUMENTS 3,753,111 8/1973 Denbnovetsky et al. .......... 368/119

4,998,109 3/1991 LeChevalier ...................... 341/166

OTHER PUBLICATIONS

"High Speed Design Seminar"/Analog Devices/pp. 1-34 to 1-37 (1989).

"Multistage Error Correcting A/D Converters-/Analog Devices, Inc. pp. 1-97 to 1-103 (Date Unknown).

*Primary Examiner*—A. D. Pellinen

*Assistant Examiner*—Brian K. Young

*Attorney, Agent, or Firm*—William A. Birdwell

[57] ABSTRACT

A dual-ranked time-interval conversion circuit. Two time trap circuits are employed to convert the time interval between a logic level transition of a first signal and a logic level transition of a second signal to an analog or digital signal representative of that time interval. Each time trap circuit employs a delay line for receiving and propagating the first signal and a series of taps and respective storage elements along the delay line for detecting and storing the logic level of the delay line at each tap at the time of receipt of a second signal. A first time trap circuit is employed to measure the time interval in course quanta of time and a second time trap circuit is employed to measure in fine quanta of time the time difference between the actual first signal-to-second signal time interval and the coarse measurement of that interval. A nulling circuit is provided for applying a delayed strobe signal to the second time trap circuit within a predetermined period of time following receipt of the first signal. This time is preferably equal to two coarse time quanta to allow for quantizing error. Delay circuits are provided to compensate for signal propagation delay through circuit devices. The outputs of the first and second time trap circuits are applied to a digital-to-analog conversion circuit or to a digital decoding circuit for producing an analog or digital output, respectively.

20 Claims, 3 Drawing Sheets

DUAL-RANKED TIME-INTERVAL CONVERSION CIRCUIT

BACKGROUND OF THE INVENTION

This invention relates to time-interval conversion circuits, particularly time-interval conversion circuits that convert a time interval between edge transitions of two signals into a third signal representative of that interval.

In electronic systems and instruments it is often desirable to employ a circuit that converts the time interval between two signals into analog voltage or digital information. For example, such conversion circuits may be used in oscilloscopes to reveal, in real time, modulation and other timing dynamics between signals. Typically, very high conversion rates and very high resolution are sought from such conversion circuits. For example, when used in oscilloscopes, such conversion circuits may need to achieve conversion rates and resolution of, respectively, greater than 100 MHz and less than 50 picoseconds.

Time intervals have been measured using circuits that can be referred to collectively as time interpolators. In their simplest form, time interpolators measure by counting clock cycles that are internally generated by the time interpolator during the time interval being measured. Although resolution is improved by using a high frequency clock, resolution is subject to an ambiguity of plus or minus one clock period. That ambiguity is introduced by the absence of coincidence between the clock and the edge transitions describing the time interval being measured. For example, if the edge transitions occur in the middle of the high state of the first and last clock cycle, the time measurement will reflect an excess clock period.

To correct for the ambiguity, time interpolators must measure the interval between the edge transitions of the signals and the clock. In linear interpolation, for example, the edge transition that starts the time interval charges a capacitor until the clock makes a low to high transition, at which time the charged capacitor is discharged at a known rate that is a small fraction of the charging rate. The discharge interval is measured by separately counting clock cycles for that interval. The time between the starting edge transition and the clock's rising edge equals (i) the product of the number of clock cycles counted for discharge, multiplied by the clock period, multiplied by the discharge rate, and (ii) divided by the charge rate. This measurement by interpolation and an analogous measurement made for the edge transition that ends the time interval are added to, or subtracted from, the time interval measurement first described above to obtain the overall measurement.

With linear interpolation, additional resolution is achieved at the cost of introducing undesirable delays associated with the discharge of a capacitor. In addition, the accuracy of the linear interpolator is limited by the frequency and accuracy of the clock, as well as by the performance of the counters and the charging and discharging circuitry. Moreover, the linear interpolator delivers a count of clock cycles that requires digital-to-analog conversion, which is generally accomplished using techniques that are not real time and are slow.

Time intervals have also been measured using a circuit that has been referred to as a time trap. A time trap circuit measures time intervals by using a delay line of known propagation rate. The delay line is tapped at equally spaced intervals along its length so that, as a first input signal propagates along the delay line, the successive taps provide a means to detect the signal's progress. Each tap corresponds to a quantum of time equal to the total propagation time of the delay line divided by the total number of taps. Each tap connects to an input of a memory device such as a digital latch so that, when the memory device is strobed by a second input signal, the latch will capture a pattern of digital information that represents the time interval between the first propagating input signal and the strobe signal.

In the time trap circuit, resolution is determined by the number of taps along a given length of delay line: a large number of taps minimizes the spatial intervals between the taps and, thereby, minimizes the quantum of time corresponding to each tap. However, the number of taps is limited by the inherent losses of the delay line and the input capacitance of the latch, as well as by minimum spacing requirements of each tap.

Accordingly, there is a need for an improved technique and circuit for converting time intervals between edge transitions of two voltage signals into a voltage or digital representation thereof in real time, with high resolution and accuracy.

SUMMARY OF THE INVENTION

The present invention fulfills the aforementioned need by providing a time-interval conversion circuit that employs a dual-ranked implementation of a time trap technique. The dual-ranked implementation uses two stages, each of which includes a time trap circuit. The first stage detects the time interval in coarse quanta, and the second stage detects in fine quanta the portion of the time interval not detected by the first stage. The second stage generates binary information with a total range corresponding to two coarse quanta of the first stage. The second stage's total range is made to correspond to two coarse quanta in order to provide two detecting functions: (i) detection in fine quanta of the portion of the time interval that eludes the first stage, and (ii) compensation for the 1-bit quantizing error inherent in the first stage. The dual-ranked implementation employs associated circuitry which synchronizes the two stages with respect to measuring the time interval. The first and second stages, together with the associated synchronization circuitry, combine to provide values of data at higher resolution than a single stage while using fewer total taps.

The time-interval conversion circuit produces digital information that is not binary encoded. From the digital information captured by the circuit, a voltage output may be produced by applying the digital information to a summing amplifier. The summing amplifier is simple, converts at very high speed and generates an output voltage that is proportional to the detected time interval. A binary encoded output may be produced by applying the digital information to a binary encoding stage. The binary encoding stage provides for digital error correction by means of half adders to add digital information from the fine stage to digital information from the coarse stage.

Accordingly, a principal object of the present invention is to provide a novel and improved circuit for detecting the time difference between two signals.

Another object of the present invention is to provide a time-interval conversion circuit that can convert a time interval between edge transitions of two signals into analog or digital information.

A further object of the present invention is to provide a time-interval conversion circuit that can function at very high conversion rates with very fine resolution.

Yet a further object of the present invention is to provide a time-interval conversion circuit that can provide fine resolution with a minimum number of components.

The foregoing and other objects, features, and advantages of the invention will be more readily understood upon consideration of the following detailed description of the invention, taken in conjunction with the accompanying drawings.

DETAILED DESCRIPTION OF THE INVENTION

Figure 1:
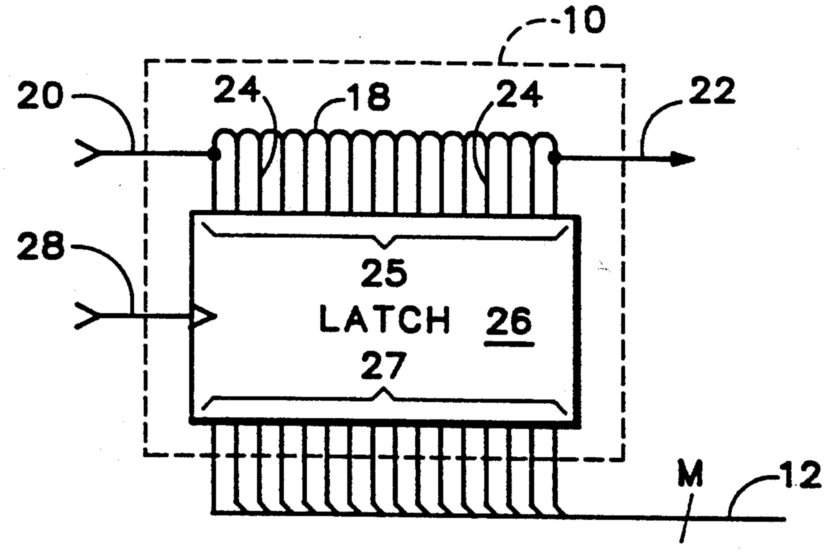
Fig. 1 PRIOR ART
FIG. 1 shows a schematic diagram of a prior art time-interval conversion circuit using the time trap technique.

A single stage time-interval conversion circuit is shown in FIG. 1 in the form of a time trap circuit 10. The time trap circuit 10 comprises a delay line 18 that includes a propagating signal input terminal 20, a propagating signal output terminal 22 and a plurality of taps 24 connected at equally-spaced intervals along the delay line 18. The number of taps 24 is represented by the variable M. The delay line 18 may be constructed from discrete elements (such as inductors and capacitors), from a microstrip line, or from some other structure without departing from the principles of the invention. The important point is that the delay line 18 must be constructed so that its propagation rate is known and so that the taps 24 can be connected at equally-spaced intervals.

The taps 24 are connected to data input terminals 25 of a multi-element digital latch 26; thence, the digital latch 26 must have data input terminals 25 that number at least M, the number of taps 24. The digital latch 26 includes data output terminals 27 and a strobe signal input terminal 28. The data output terminals 27 number at least M and connect the time trap circuit 10 to the digital bus 12, a parallel bus that is at least M bits wide.

The operation of the time trap circuit 10 can be understood by reference to the propagation of a transition of a first voltage signal applied to the propagating signal input terminal 20. Once applied, the first voltage signal propagates along the delay line 18, successively past each tap 24. Because each tap 24 is equally-spaced along the delay line 18 and the delay line 18 has a known propagation rate, each tap 24 corresponds to a quantum of time D(c) equal to the total propagation time of the delay line 18 divided by M, the total number of taps 24. Each tap 24 is connected to one of the data input terminals 25 of the digital latch 26 so that, when the digital latch 26 is strobed by a transition of a second voltage signal applied at the strobe signal input terminal 28, the digital latch 26 will capture information representing, at the time of the strobe, the level of the first voltage signal at each of the taps 24. That is, the taps 24 detect and provide to the digital latch 26 information respecting the progress of the transition of the first voltage signal along the delay line 18 which information corresponds to the time interval between the transitions of the first voltage signal and the second voltage signal.

The information captured by the digital latch 26 is in thermometer coded form; it is digital, but it is not binary encoded. For thermometer coding, the information comprises a linear scale where each bit in the scale has an equal weight such that the number of possible values that the information can attain is exactly equal to M, the number of bits captured. For example, (i) if each tap 24 corresponds to a quantum of time D(c) equal to 50 picoseconds, (ii) if M equals 16 and (iii) if the digital latch 26 captures a digital string 1111111111110000, then the time interval equals $12 \times D(c)$ or 600 picoseconds, the number of logical one levels multiplied by the applicable time quantum.

For a delay line 18 of known propagation rate, the resolution of the time trap circuit 10 is determined by the number of taps 24 disposed over a given length of delay line 18. Increasing the number of taps 24 reduces the spatial intervals between the taps 24 and accordingly reduces the quantum of time D(c) corresponding to each tap 24. However, the maximum number of taps 24 disposed over a given length of delay line 28 is subject to practical limitations resulting from the finite number of inputs that can be provided on a digital latch or other memory device and the need to couple the delay line to that device physically.

Moreover, the number of taps 24 is limited by the inherent losses of the delay line 18 and the input capacitances of the data input terminals 25 of the digital latch 26. For example, the inherent losses of the delay line 18 and the input capacitances of the digital latch 26 have been observed to degrade voltage signals applied to the propagating signal input terminal 20 after as few as sixteen taps 24.

Therefore, increasing the number of taps 24 to increase the number of attainable values or the resolution has practical limitations. Although the above-described limitations may not impede implementation of a conversion circuit using two hundred fifty-six taps 24 of relatively coarse resolution to produce an eight-bit binary encoded output, the above-described limitations may impede the implementation of a conversion circuit to produce a higher order binary encoded output with relatively fine resolution. For example, the limitations could preclude implementation of a circuit to produce a sixteen-bit binary encoded output of relatively fine resolution because implementation using such an embodiment would require over sixty-five thousand closely-spaced taps 24. This problem is solved in applicant's invention by providing a dual-ranked structure wherein time trap circuit 10 is paired with a second time trap circuit.

Figure 2:
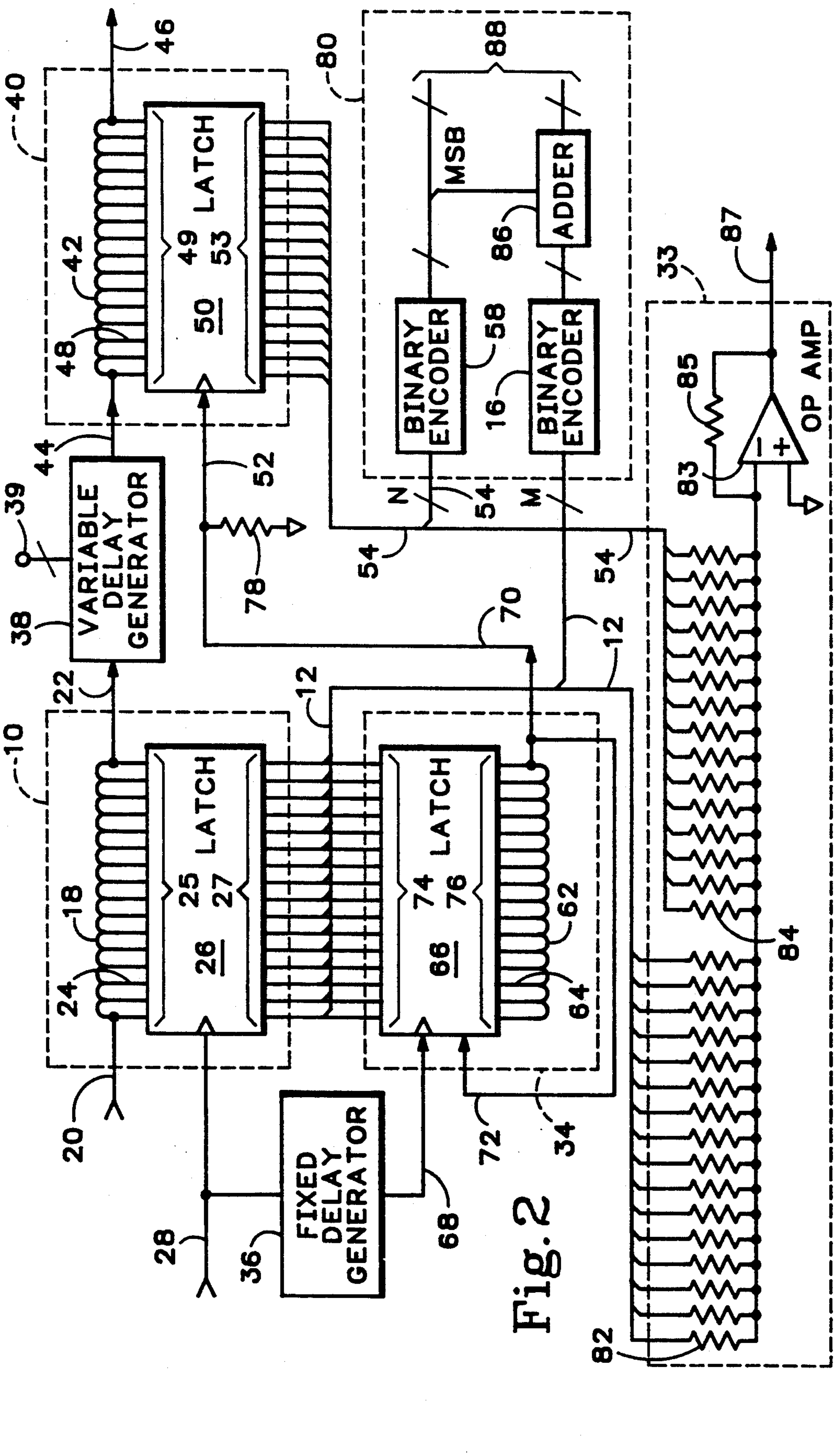
FIG. 2 shows a preferred embodiment of a time-interval conversion circuit according to the present invention.

FIG. 2 shows a preferred embodiment of a dual-ranked time-interval conversion circuit according to the invention. Referring to FIG. 2, the time trap circuit 10 is connected by a digital bus 12 to a summing amplifier 33, to a priority binary encoder 16 and to a programmable delay generator 34. The strobe signal input terminal 28 of the time trap circuit 10 is connected in parallel to a fixed delay generator 36 so that the second voltage signal is simultaneously directed to both structures. The fixed delay generator 36 may be constructed from discrete elements (such as inductors and capacitors) or some other structure without departing from the principles of the invention. However, the fixed delay generator 36 is preferably constructed so that it can delay the propagation of the second voltage signal to the programmable delay generator 34 by a fixed amount.

The propagating signal output terminal 22 of the time trap circuit 10 is connected to a variable delay generator 38. The variable delay generator 38 includes a calibration input 39. The output of the variable delay generator 38 is connected to a second time trap circuit 40. The variable delay generator 38 may be constructed from discrete elements (such as inductors and capacitors) or using some other structure without departing from the principles of the invention. In either case, the variable delay generator 38 is to be constructed so that it can delay the propagation of the first voltage signal from the first time trap circuit 10 to the second time trap circuit 40, for the reason explained below, and so that such delay is variable.

The second time trap circuit 40 comprises a delay line 42 that includes a propagating signal input terminal 44, a propagating signal output terminal 46 and a plurality of taps 48 connected at equally-spaced intervals along the delay line. The propagating signal input terminal 44 is the point of connection between the second time trap circuit 40 and the variable delay generator 38. The number of taps 48 is represented by the variable N. As with delay line 18 of the time trap circuit 10, the delay line 42 may be constructed from discrete elements (such as inductors and capacitors), from a microstrip line or from some other structure without departing from the principles of the invention. However, the delay line 42 is preferably constructed so that its propagation rate is known and so that the taps 48 can be connected at equally-spaced intervals.

The taps 48 are connected to data input terminals 49 of a digital latch 50; thence, the digital latch 50 must have data input terminals that number at least N, the number of taps 48. The digital latch 50 includes a strobe signal input terminal 52 that is the point of connection between the second time trap circuit 40 and the programmable delay generator 34. The digital latch 50 includes data output terminals 53 that number at least N and that connect the second time trap circuit 40 to a second digital bus 54 that is at least N bits wide. The second digital bus 54 connects the second time trap circuit 40 both to the summing amplifier 33 and to a second priority binary encoder 58.

The programmable delay generator 34 comprises (i) a delay line 62, (ii) a plurality of taps 64 connected at equally-spaced intervals along the longitude of the delay line 62, and (iii) a digital latch 66 that includes a strobe signal input terminal 68, a delayed strobing signal output terminal 70, a clearing input terminal 72, data input terminals 74 and data output terminals 76. The strobe signal input terminal 68 is the point of connection between the programmable delay generator 34 and the fixed delay generator 36. The delayed strobing signal output terminal 70 is connected in parallel both to the strobe signal input terminal 52 of the second time trap circuit 40 (as terminated by a resistor 78) and to the clearing input terminal 72 of latch 66.

Each one of the data input terminals 74 is connected to one of the M data output terminals 27 of the time trap circuit 10; thence, the data input terminals 74 number at least M. Each of the data output terminals 76 of the programmable delay generator 34 is connected to one of the taps 64; thence, the taps 64 number M, the number of taps 24 of time trap circuit 10. The delay line 62 may be constructed from discrete elements (such as inductors and capacitors), from a microstrip line, or from some other structure without departing from the principles of the invention. However, the delay line 62 is preferably constructed so that its propagation rate is known and so that the taps 64 can be connected at equally-spaced intervals along its longitude. Moreover, the delay line 62 is preferably constructed like the delay line 18 of time trap 10.

The output stage of the dual-ranked time-interval conversion circuit comprises the summing amplifier 33 and the binary output stage 80. The summing amplifier 33 and the binary output stage 80 each comprise conventional circuits that are readily understood by those skilled in the art. The summing amplifier 33 includes a first set of resistors 82 that are M in number, that connect the summing amplifier 33 to the digital bus 12 and each of which has an equal resistance designated as R(m). The summing amplifier 33 includes a second set of resistors 84 that are N in number, that connect the summing amplifier 33 to the digital bus 54 and each of which has an equal resistance designated as R(n). The summing amplifier 33 also includes an operational amplifier 83, a scaling resistor 85 of value R(s) and a proportional voltage output terminal 87. R(s) is chosen to achieve a desired gain from summing amplifier 33. The binary output stage 80 comprises a priority binary encoder 16, a second priority binary encoder 58, a binary adder 86 and a set of binary encoded output terminals 88. Although the embodiment shown in FIG. 2 employs the summing amplifier 33 and the binary output stage 80, it is to be recognized that other output structures could be employed without departing from the principles of the invention. However, it is preferred that the data outputs of the digital latch 26 of the time trap circuit 10 and data outputs of the digital latch 50 of the second time trap circuit 40 are in the form of digital information correlating to the time interval detected.

In the dual-ranked time-interval conversion circuit shown in FIG. 2 the first time trap circuit 10 detects time intervals in coarse quanta of time and the second time trap circuit detects time intervals in fine quanta of time. The operation of the dual-ranked time-interval circuit can be understood by considering the propagation of a transition of a first voltage signal applied at the propagating signal input terminal 20. As described above for the single stage conversion circuit of FIG. 1, the first voltage signal propagates along the delay line 18, successively past taps 24, each tap 24 corresponding to a known, coarse quantum of time D(c). Each tap 24 is connected to one of the data input terminals 25 of the digital latch 26 so that, when the digital latch 26 is strobed by a transition of a second voltage signal applied at the strobe signal input terminal 28, the digital latch 26 will capture digital information representing, at the time of the strobe, the digital level of the first voltage signal at each of the taps 24. The information captured and provided in digital form by the first time trap circuit 10 at its outputs corresponds to the time interval between transitions of the first voltage signal and the second voltage signal, detected in the coarse quanta of time D(c).

Detection in fine quanta of time is performed by the second time trap circuit 40 in a manner analogous to detection in coarse quanta. Accordingly, operation of the second time trap circuit 40 can be understood by consideration of the propagation of the transition of the first voltage signal following application of the transition of the second voltage signal to the strobe signal input terminal 28. Following detection by the first time trap circuit 10, the first voltage signal continues to propagate along the delay line 18, eventually passing out the propagating signal output terminal 22 and into the variable delay generator 38. After being delayed by the variable delay generator 38, the first voltage signal is applied to the second time trap circuit 40 at the propagating signal input terminal 44. The first voltage signal propagates along the delay line 42 successively past taps 48, each tap 48 corresponding to a known quantum of time D(f). Each tap 48 is connected to one of the data input terminals 49 of the digital latch 50 so that, when the digital latch 50 is strobed, the digital latch 50 will capture digital information representing, at the time of the strobe, the state of the first voltage signal at each of the taps 48. The information captured and provided in digital form by the second time trap circuit 40 at its outputs is detected in fine quanta of time D(f) and corresponds to the portion of the coarse time interval D(c) between the transitions of the first voltage signal and the second voltage signal not detected by the first time trap circuit 10.

The resolution of the conversion circuit is determined by the fine quanta of time D(f). The resolution of the conversion circuit increases as either the propagation rate of the delay line 42 is increased for a given spacing of taps 48, or the spacing of taps 48 is decreased for a given length of delay line 42. In the embodiment shown, it is to be understood that the propagation rates are equal for the delay lines 18 and 42 and, consequently, the fine quanta of time D(f) are established by the spacing between the taps 48 of the delay line 42. It is to be further understood that the fine quanta of time D(f) may be also be achieved by using a delay line 42 with a faster propagation rate than that of delay line 18, or by some other structure or technique, or combination of techniques, without departing from the principles of the invention. In any case, it is preferred that the second time trap circuit 40 is constructed so that the quantum of time D(f) corresponding to each tap 48 is a small, known fraction of the quantum of time D(c) corresponding to each tap 24 of the first time trap circuit 10.

In the embodiment shown, the spacing between taps 48 of the second time trap circuit 40 renders D(f) equal to 2D(c)/N where (i) D(c) is the coarse quantum of time detected by each tap 24 of the first time trap circuit 10 and (ii) N is the number of taps 48 of the second time trap circuit 40. The total time range of the second time trap circuit 40 is the product of D(f) and N, which product equals two coarse quanta of time D(c). The range of the second time trap circuit 40 corresponds to two coarse quanta of time D(c) because the second time trap circuit 40 has two detection tasks: (i) the second time trap circuit 40 detects, when strobed, the portion of the time interval corresponding to the intra-tap separation between the leading edge transition of the propagating first voltage signal and the last of the taps 24 past which the signal has propagated, and (ii) the second time trap circuit 40 guards against failure of the last of the taps 24 past which the signal has propagated to detect the passage of the leading edge transition of the propagating signal. That is, the second time trap delay line requires a range equal to two coarse quanta of time in order to account for a quantizing error of one bit.

The dual-ranked implementation requires associated circuitry to synchronize the two stages with respect to the application of the propagating first voltage signal and the second voltage signal. The associated circuitry uses the time interval detected in the first time trap circuit 10 to force the first voltage signal and the delayed strobing signal generated by the programmable delay generator within one coarse time quantum D(c). So forcing the signals reduces the time difference between the signals to within the range of the second time trap circuit 40. That time difference is then detected in fine quanta of time D(f) by the second time trap circuit 40.

In the preferred embodiment shown in FIG. 2, such associated circuitry comprises the programmable delay generator 34, the fixed delay generator 36 and the variable delay generator 38. In operation, the digital information detected by the first time trap circuit 10 is routed to the data input terminals 74 of the digital latch 66 of the programmable delay generator 34. The digital latch 66 captures the digital information upon application of the transition of the second voltage signal at the strobe signal input terminal 68 of the digital latch 66. The second voltage signal is applied to the strobe signal input terminal 68 after being delayed by the fixed delay generator 36, which delay is of a fixed amount that is sufficient to allow time trap circuit 10 to have detected the first voltage signal and to have achieved a settled digital output at the data output terminals 27 of the digital latch 26.

Once the transition of the second voltage signal is applied to the strobe signal input terminal 68 the digital information of the first time trap circuit 10 appears at the data output terminals 76 of the programmable delay generator 34. Because the taps 64 connect the data output terminals 76 to the delay line 62, the digital information that appears at the data output terminals 76 is applied to the delay line 62. Accordingly, the data output terminals 76 of the programmable delay generator 34 are preferably constructed using a "wire-ord" implementation, as with emitter coupled logic. Once so applied, the logic high digital level corresponding to the leading edge transition of the first voltage signal propagates down the delay line 62 to the delayed strobing output terminal 70 and, then, to the strobe signal input terminal 52 of the second time trap circuit 40, thereby causing the second time trap circuit 52 to detect the first voltage signal. The delayed strobing signal generated by the programmable delay generator 34 and output at the delayed strobing output terminal 70 is simultaneously routed to the clearing input terminal 72 of the programmable delay generator 34, thereby resetting the data output terminals 76 to a voltage level corresponding to logic zero. The delayed strobing signal produced by the programmable delay generator 34 is forced within one coarse quantum D(c) of the propagating transition of the first voltage signal as a consequence of close matching, by propagation rate, length and tap-spacing, of delay line 62 of the programmable delay generator 34 to the delay line 28 of the first time trap circuit 10. To illustrate, it may be assumed that no other source of propagation delay exists and that no quantizing error occurs when the first time trap circuit 10 detects the leading edge transition of the first voltage signal. Under those assumptions, after the time trap circuit 10 detects the transition of the first voltage signal the first voltage signal continues to propagate along the delay line 18, eventually reaching the propagating signal output terminal 22. With the strobe's application, a tap T(d) of the taps 24 of the first time trap circuit 10 will have detected, within one coarse time quantum D(c), the leading edge transition of the first voltage signal. Tap T(d) will pass a digital representation of the time between transitions of each signal, i.e., a logical one, to a tap T(d') of taps 64 of the programmable delay generator 34, whereby tap T(d'), connected to delay line 62, will launch a strobing signal to propagate along the delay line 62. If the delay lines 62 and 28 are closely matched by length and tap-spacing, the first voltage signal and the delayed strobing signal have the same length of delay line (within one tap, corresponding to the coarseness of the detection) through which to propagate in reaching the output of the first time trap circuit 10 or the programmable delay generator 34, respectively. Moreover, if the delay lines 62 and 28 are also closely matched by propagation rate, the first voltage signal and the delayed strobing signal will arrive within one coarse quantum of time D(c) at such outputs.

Figure 3:
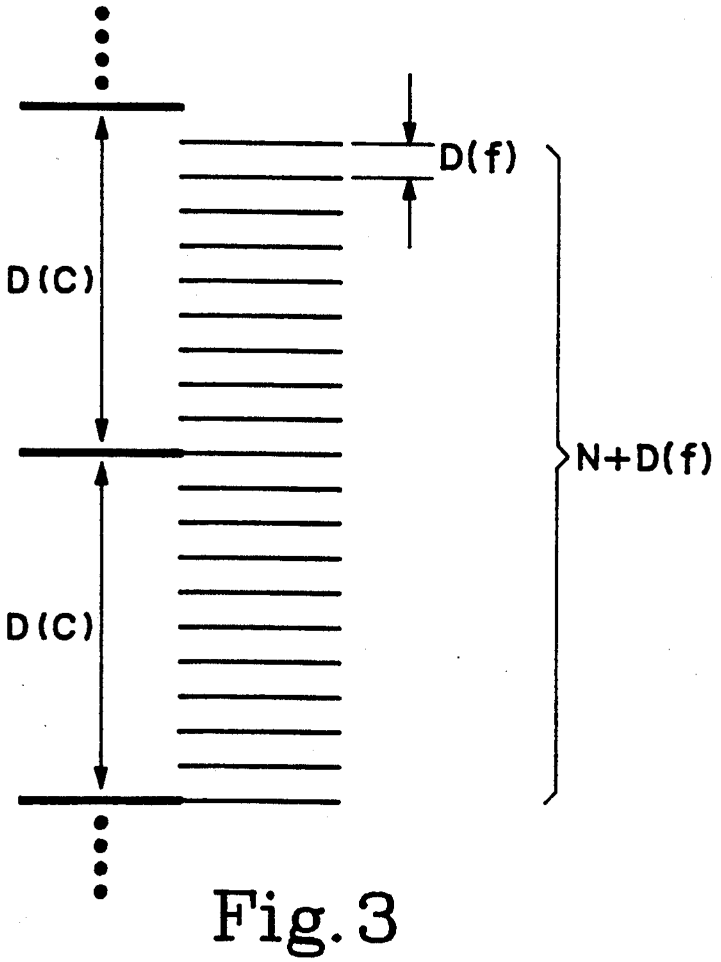
FIG. 3 shows the alignment and relative value of coarse quanta of time measured by a first stage of the circuit of FIG. 2 and fine quanta of time measured by a second stage of said circuit.

In practice, there are sources of propagation delay besides the delay line itself. For example, additional delays are introduced by the fixed delay generator 36 and device propagation delays in the latches 26 and 66. Consequently, the variable delay generator 38 is provided to compensate for such other sources of delay, thereby synchronizing the two stages with respect to the propagating first input voltage signal and the delayed strobing signal generated by the programmable delay generator 34. In other words, the variable delay generator 38 effects an alignment of the stages such that the N fine quanta of time D(f) subdivide two coarse quanta of time D(c) as illustrated in FIG. 3. In operation, the variable delay generator 38 is adjusted to the conversion circuit by means of the calibration input 39 in order to so compensate and synchronize.

Also, in practice the first time trap 10 may fail to detect the leading edge transition of the propagating first input voltage signal by one coarse time quantum D(c). In that case, the resulting quantizing error is passed to the programmable delay generator 34 such that the delayed strobing signal generated by the programmable delay generator 34 will arrive at second time trap circuit 40 late by one coarse time quantum D(c). Because that error is possible, the range of the second time trap circuit 40 is two coarse time quanta, as previously discussed; in the absence of the quantizing error, the range need only be one coarse time quantum because the two stages are synchronized to within one coarse quantum.

The digital information captured by the dual-ranked conversion circuit is in thermometer coded form; it is digital, but it is not binary encoded. For thermometer coding in a dual-ranked implementation, the information comprises a linear scale, wherein each bit of the coarse stage has an equal weight and each bit of the fine stage has an equal weight, but each bit of the coarse stage has a greater weight than each bit of the fine stage. More specifically, if N bits are captured by a fine stage with a range equal to two bits of the coarse stage, each bit in the fine stage has a weight of (2/N) times the weight of a bit in the coarse stage.

Moreover, the number of possible values that the captured digital information can attain is equal to the product of N and (M-1), where N is the number of taps 48 in the fine stage and M is the number of taps 24 in the coarse stage. M-1 reflects that the fine stage has a range of two coarse quanta for error detection purposes so that overlap exists between the detections performed by each stage. For example, if (i) each quantum of time D(c) equals 50 picoseconds, (ii) M equals 16, (iii) N equals 16, (iv) the digital latch 26 of the coarse stage captures a digital string 1111111111110000, and (v) the digital latch 50 of the fine stage captures a digital string 1111111111110000, then (a) the fine quantum of time D(f) is 6.25 picoseconds (given by $D(f)=D(c)\times 2/N$) and (b) the time interval equals 675 picoseconds (given by $12\times D(c)+12\times D(f)$), the sum of the products of the number of logical one levels for each stage multiplied by the applicable time quantum.

Because the digital information captured by the digital latches 26 and 50 in the dual-ranked embodiment is in thermometer coded form, the summing amplifier 33 produces a voltage proportional to the number of logical one levels in the digital information, which voltage is produced at the proportional voltage output terminal 87. The larger the time interval is between the transition of the first voltage signal applied to propagating signal input terminal 20 and the second voltage signal applied to the strobe signal input terminal 28, the larger the voltage output is at proportional voltage output terminal 87. However, the contributions of each of the fine stage and the coarse stage must be weighted in producing the proportional voltage output. Accordingly, if the resistors associated with the coarse stage have a resistance of R(m), the resistors associated with the fine stage will have a resistance of $R(n)=R(m)\times N/2$.

The digital information is readily converted to an encoded form for output in parallel at the binary encoded output terminals 88. The binary adder 86 corrects for the quantizing error in the binary encoding between the priority binary encoder 16 for the coarse stage and the second priority binary encoder 58 for the fine stage. The error results when the coarse stage fails to detect the leading edge of the first voltage signal by one coarse time quantum. The information that the coarse stage fails to capture is captured by the fine stage and is encoded by the second binary encoder 58 as its most significant bit, a value corresponding to one coarse quantum of time D(c).

Figure 4:
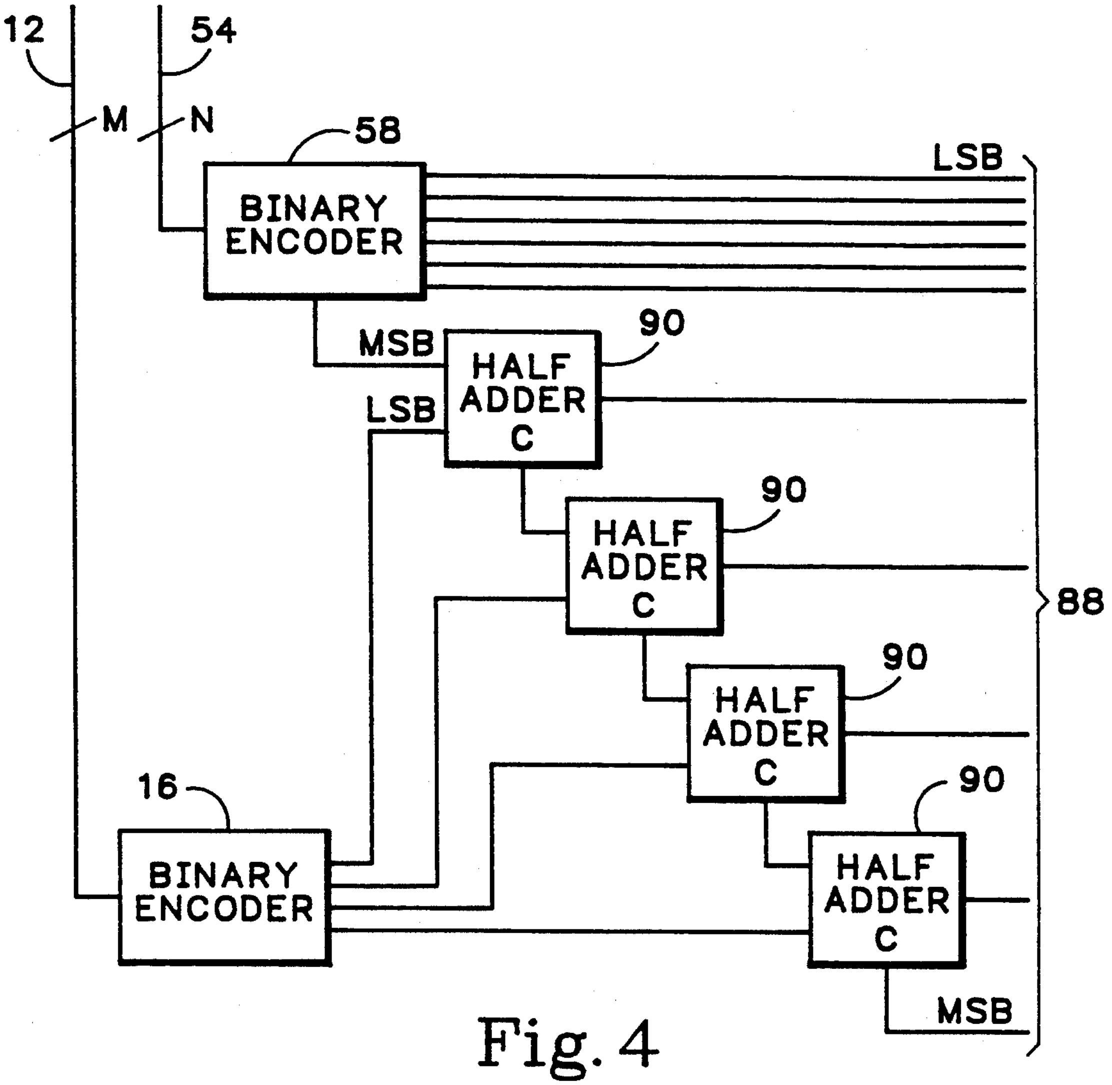
FIG. 4 shows a preferred embodiment of the binary adder shown in FIG. 2.

As shown in FIG. 4, the binary adder 86 comprises a set of half-adders 90, equal in number to the number of binary encoded bits provided by the priority binary encoder 16. In that configuration, the most significant bit of the second priority binary encoder 58 is added to the least significant bit of the priority binary encoder 16, the resulting binary sum is produced and the carry bit is added to the next least significant bit of the priority binary encoder 16, and so on—a method readily understood by those skilled in the art.

Figure 5:
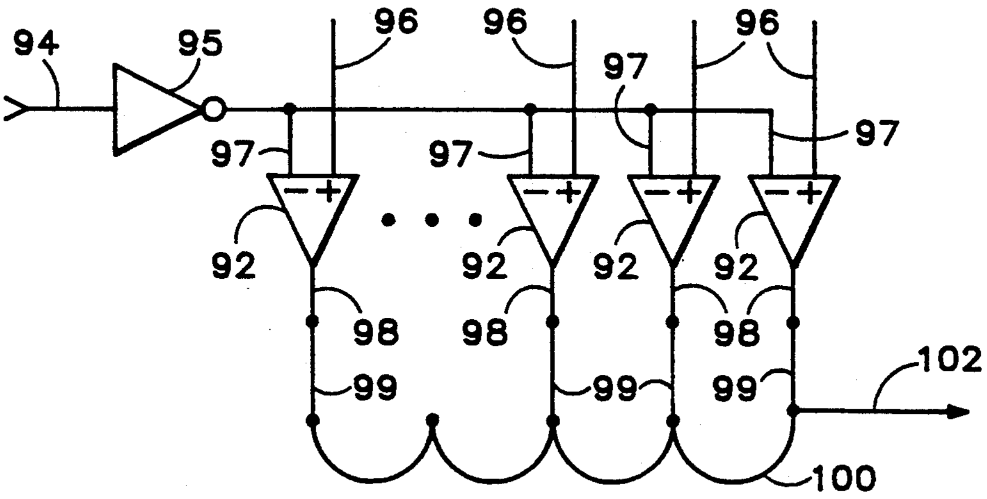
FIG. 5 shows an alternative embodiment of a programmable delay generator for use in a time-interval conversion circuit according to the present invention.

Referring to FIG. 5, an alterative embodiment of the programmable delay generator 34 is shown. The alternative embodiment comprises a plurality of voltage comparators 92, a strobe signal input terminal 94, a strobe invertor 95, comparator data terminals 96, comparator strobe terminals 97, comparator output terminals 98, a plurality of taps 99, a delay line 100 and a delayed strobe signal output terminal 102. This alternative embodiment uses the voltage comparators 92 as a memory device, each comparator comprising a storage element, in place of the digital latch 66. Consequently, it eliminates the need to route a signal to clear the programmable delay generator 34.

In operation, a strobing voltage signal is applied at strobe signal input terminal 94. It is inverted by strobe invertor 95, with the inverted strobing voltage signal applied to each of the comparators 92 at the comparator strobe terminals 97. When the strobing voltage signal makes a transition from logic low to logic high, the comparators 92 that have comparator data terminals 96 at logic high will output a logic high at their comparator output terminals 98, which voltage levels are transferred through the taps 99 to the input of the delay line 100, thereby initiating a delayed strobing signal in the delay line 100. The delayed strobing signal propagates through the delay line 100 and is produced at the delayed strobe signal output terminal 102. When the strobing voltage signal makes a transition from logic high to logic low, the comparators 92 all return to a logic low state.

The terms and expressions which have been employed in the foregoing specification are employed therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A conversion circuit for converting a time interval between logic level transitions of a first signal and a second signal into a third signal representative of said time interval, comprising:

(a) a first time trap circuit, responsive to said first signal and said second signal, for detecting and storing in coarse quanta of time D(c) a representation of the logic level of said first signal at the time of a logic level transition of said second signal;

(b) a second time trap circuit, responsive to said first signal and a delayed strobe signal, for detecting and storing in fine quanta of time D(f) a representation of the logic level of said first signal at the time of application of said delayed strobe signal to said second time trap circuit; and (c) nulling means, responsive to said representation of the logic level of said first signal at the time of a logic level transition of said second signal, for applying said delayed strobe signal to said second time trap circuit within a predetermined period of time following the application of said first signal to said second time trap circuit, said predetermined period of time comprising two course quanta of time D(c).

2. A conversion circuit for converting a time interval between logic level transitions of a first signal and a second signal into a third signal representative of said time interval, comprising:

(a) a first time trap circuit, responsive to said first signal and said second signal, for detecting and storing in coarse quanta of time D(c) a representation of the logic level of said first signal at the time of a logic level transition of said second signal;

(b) a second time trap circuit, responsive to said first signal and a delayed strobe signal, for detecting and storing in fine quanta of time D(f) a representation of the logic level of said first signal at the time of application of said delayed strobe signal to said second time trap circuit; and (c) nulling means, responsive to said representation of the logic level of said first signal at the time of a logic level transition of said second signal, for applying said delayed strobe signal to said second time trap circuit within a predetermined period of time following the application of said first signal to said second time trap circuit, wherein at least one said time trap circuit comprises a delay line having an input for receiving and propagating therealong said first signal, and memory means, having a plurality of distinct storage elements, respective element inputs connected to said delay line at predetermined intervals, corresponding element outputs and a strobe input, for storing representations of the signal logic levels present at said element inputs at the time of application of a signal to said strobe input and providing said signal logic levels at said corresponding element outputs.

3. The conversion circuit of claim 3, wherein said memory means comprises a multi-element digital latch, the data inputs of said latch corresponding to the element inputs of said memory means and the data outputs corresponding to said element outputs of said memory means.

4. The conversion circuit of claim 3, wherein said memory means comprises a plurality of comparators arranged in series, one input of each successive comparator corresponding to an element input of said memory means, the other input of each comparator comprising a strobe input and the output of each comparator corresponding to an element output.

5. The conversion circuit of claim 3, wherein said delay line comprises a microstrip transmission line.

6. A conversion circuit for converting a time interval between logic level transitions of a first signal and a second signal into a third signal representative of said time interval, comprising:

(a) a first time trap circuit, responsive to said first signal and said second signal, for detecting and storing in coarse quanta of time D(c) a representation of the logic level of said first signal at the time of a logic level transition of said second signal, said first time trap circuit comprising a first delay line, having a predetermined propagation rate and an input for receiving and propagating therealong said first signal; and first memory means, having a plurality of distinct storage elements, respective element inputs connected to said first delay line at predetermined intervals, corresponding element outputs and a first strobe input, for storing representations of the signal logic levels present at said element inputs at the time of application of said second signal to said first strobe input and providing said signal logic levels at said corresponding element outputs;

(b) a second time trap circuit, responsive to said first signal and a delayed strobe signal, for detecting and storing in fine quanta of time D(f) a representation of the logic level of said first signal at the time of application of said delayed strobe signal to said second time trap circuit; and (c) nulling means, responsive to said representation of the logic level of said first signal at the time of a logic level transition of said second signal, for applying said delayed strobe signal to said second time trap circuit within a predetermined period of time following the application of said first signal to said second time trap circuit, said nulling means comprising second memory means, having a plurality of distinct storage elements, respective element inputs connected to corresponding element outputs of said first memory means, corresponding second memory means outputs, a second strobe input and a second delay line connected to said second memory means outputs, said second delay line having a propagation rate substantially the same as the propagation rate of said first delay line, for receiving and storing said logic level representations from said element outputs of said first memory means and transferring them to said second delay line, said delayed strobe signal being produced by the arrival of said representation at an output disposed a predetermined distance along said second delay line.

7. The conversion circuit of claim 7, further comprising variable delay means, connected between an output disposed a predetermined distance along said delay line and said second time trap circuit, for delaying application of said first signal to said second time trap circuit, which delay is calibrated to synchronize said first signal with said delayed strobe signal applied by said nulling circuit.

8. The conversion circuit of claim 7, further comprising fixed delay means, responsive to said second signal and connected to said second strobe input, for delaying application of said second signal to said second strobe input by a fixed amount of time, which amount of time is at least equal to the amount of time necessary for said first memory means to produce settled logic levels at said element outputs of said first memory means.

9. The conversion circuit of claim 7, wherein said second time trap circuit comprises a third delay line, having a predetermined propagation rate and an input for receiving and propagating therealong said first signal; and third memory means, having a plurality of distinct storage elements, respective element inputs connected to said third delay line at predetermined intervals, corresponding element outputs and a third strobe input, for storing representations of the signal logic levels present at said element inputs of said third memory means at the time of application of said delayed strobe signal to said third strobe input and providing said signal logic levels at said corresponding element outputs of said third memory means.

10. A conversion circuit for converting a time interval between logic level transitions of a first signal and a second signal into a third signal representative of said time interval, comprising:

(a) a first time trap circuit, responsive to said first signal and said second signal, for detecting and storing in coarse quanta of time D(c) a representation of the logic level of said first signal at the time of a logic level transition of said second signal;

(b) a second time trap circuit, responsive to said first signal and a delayed strobe signal, for detecting and storing in fine quanta of time D(f) a representation of the logic level of said first signal at the time of application of said delayed strobe signal to said second time trap circuit; and (c) nulling means, responsive to said representation of the logic level of said first signal at the time of a logic level transition of said second signal, for applying said delayed strobe signal to said second time trap circuit within a predetermined period of time following the application of said first signal to said second time trap circuit, wherein each said time trap circuit comprises a delay line having an input for receiving and propagating therealong said first signal, and memory means, having a plurality of distinct storage elements, respective element inputs connected to said delay line at predetermined intervals, corresponding element outputs and a strobe input, for storing representations of the signal logic levels present at said element inputs at the time of application of a signal to said strobe input and providing said representations at said corresponding element outputs.

11. The conversion circuit of claim 11, wherein said coarse quanta of time D(c) are equal to the total delay time of said delay line of said first time trap circuit divided by the number M of memory means storage elements of said first time trap circuit and the propagation rate of said delay line of said second time trap circuit is chosen so that said fine quanta of time $D(f)=D(c)\times 2/N$, where N is the number of storage elements of said second memory means of said second time trap circuit.

12. The conversion circuit of claim 11, wherein said nulling means comprises a nulling delay line connected to said element outputs of said memory means of said first time trap circuit for receiving and propagating therealong said delayed strobe signal representative of the time difference between transitions of said first signal and said second signal, said strobe input of said second time trap circuit being connected to said nulling delay line at an output disposed a predetermined distance therealong.

13. The conversion circuit of claim 13, further comprising nulling memory means electrically disposed between said memory means of said first time trap circuit and said nulling delay line for storing said representations of signal levels provided by said outputs of said memory means of said first time trap circuit and applying said representations to said nulling delay line, said nulling memory means having a plurality of distinct storage elements, respective element inputs connected to respective element outputs of said memory means of said first time trap circuit, corresponding element outputs connected to said nulling delay line and a strobe input for receiving said second signal.

14. The conversion circuit of claim 11, further comprising output means, connected to said element outputs of said memory means of said first time trap circuit and to said element outputs of said memory means of said second time trap circuit, for translating the digital data provided by said memory means of said first and second time trap circuits into an analog equivalent output.

15. The conversion circuit of claim 15, wherein said output means comprises a summing amplifier that translates the digital data provided by said memory means of said first and second time trap circuits into a voltage proportional to said time interval.

16. The conversion circuit of claim 15, wherein said output means comprises a binary output stage having (i) a first priority binary encoder connected to said element outputs of said memory means of said first time trap circuit, (ii) a second priority binary encoder connected to said element outputs of said memory means of said second time trap circuit, and (iii) a plurality of binary half adders, so that the most significant bit output by said second priority binary encoder is added to the least significant bit of said first priority binary encoder with the carry bit, if any, of that operation added to the next least significant bit of said first priority binary encoder, and so on, such that the outputs of said first priority binary encoder, said second priority binary encoder and said plurality of half adders translate the digital data captured by said memory means of said first and second time trap circuit into a binary encoded output.

17. A conversion circuit for converting a time interval between logic level transitions of a first signal and a second signal into a third signal representative of said time interval, comprising:

(a) a first time trap circuit, responsive to said first signal and said second signal, for detecting and storing in coarse quanta of time D(c) a representation of the logic level of said first signal at the time of a logic level transition of said second signal;

(b) a second time trap circuit, responsive to said first signal and a delayed strobe signal, for detecting and storing in fine quanta of time D(f) a representation of the logic level of said first signal at the time of application of said delayed strobe signal to said second time trap circuit;

(c) nulling means, responsive to said representation of the logic level of said first signal at the time of a logic level transition of said second signal, for applying said delayed strobe signal to said second time trap circuit within a predetermined period of time following the application of said first signal to said second time trap circuit; and (d) variable delay means, connected between said first time trap circuit and said second time trap circuit, for delaying the application of said first signal to said second time trap circuit a predetermined amount, which delay is calibrated to synchronize said first signal with said delayed strobe signal applied by said nulling means.

18. A conversion circuit for converting a time interval between logic level transitions of a first signal and a second signal into a third signal representative of said time interval, comprising:

(a) a first time trap circuit, responsive to said first signal and said second signal, for detecting and strobing in coarse quanta of time D(c) a representation of the logic level of said first signal at the time of a logic level transition of said second signal;

(b) a second time trap circuit, responsive to said first signal and a delayed strobe signal, for detecting and storing in fine quanta of time D(f) a representation of the logic level of said first signal at the time of application of said delayed strobe signal to said second time trap circuit;

(c) nulling means, responsive to said representation of the logic level of said first signal at the time of a logic level transition of said second signal, for applying said delayed strobe signal to said second time trap circuit within a predetermined period of time following the application of said first signal to said second time trap circuit, said nulling means comprising a nulling delay line for receiving and propagating therealong said representation of the logic level of said first signal detected by said first time trap circuit, said second time trap circuit being connected to said nulling delay line at an output disposed a predetermined distance therealong whereby said representation produces said delayed strobe signal, and a transfer means, connected between said first time trap circuit and said nulling delay line, for receiving from said first time trap circuit and applying to said nulling delay line said representation of the logic level of said first signal detected by said first time trap circuit.

19. The conversion circuit of claim 19, further comprising fixed delay means, connected to said transfer means, for delaying by a fixed amount of time, application of said representation of the logic level of said first signal detected by said first time trap circuit to said nulling delay line, which amount of time is at least equal to the amount of time necessary for said transfer means to receive and produce said representation at settled logic levels for application to said nulling delay line.

20. A conversion circuit for converting a time interval between logic level transitions of a first signal and a second signal into a third signal representative of said time interval, comprising:

(a) a first time trap circuit, responsive to said first signal and controlled by said second signal, for detecting and storing in coarse quanta of time D(c) a representation of the logic level of said first signal at the time of a logic level transition of said second signal;

(b) a second time trap circuit, responsive to said first signal and controlled by a delayed strobe signal, for detecting and storing in fine quanta of time D(f) a representation of the logic level of said first signal at the time of application of said delayed strobe signal to said second time trap circuit; and (c) nulling means, responsive to said first time trap circuit's representation of the logic level of said first signal at the time of a logic level transition of said second signal, for translating said first time trap circuit's representation into said delayed strobe signal and for applying said delayed strobe signal to said second time trap circuit within a predetermined period of time following the application of said first signal to said second time trap circuit whereby said second time trap circuit detects in fine quanta the portion of the time interval between said first signal and said second signal not detected by said first time trap circuit.

* * * * *